United States Patent
Zeng et al.

(10) Patent No.: US 11,302,687 B2
(45) Date of Patent: Apr. 12, 2022

(54) SEMICONDUCTOR DEVICE AND METHOD OF FORMING THE SAME

(71) Applicant: GLOBALFOUNDRIES Singapore Pte. Ltd., Singapore (SG)

(72) Inventors: Jie Zeng, Singapore (SG); Raunak Kumar, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 65 days.

(21) Appl. No.: 16/668,060

(22) Filed: Oct. 30, 2019

(65) Prior Publication Data

US 2021/0134787 A1 May 6, 2021

(51) Int. Cl.
*H01L 27/02* (2006.01)
*H01L 29/06* (2006.01)
(Continued)

(52) U.S. Cl.
CPC ........ *H01L 27/0259* (2013.01); *H01L 29/063* (2013.01); *H01L 29/0649* (2013.01); *H01L 29/66234* (2013.01); *H01L 29/7302* (2013.01)

(58) Field of Classification Search
CPC .......... H01L 27/0259; H01L 29/66234; H01L 29/063; H01L 29/0649; H01L 29/7302
See application file for complete search history.

(56) References Cited

U.S. PATENT DOCUMENTS 5,011,784 A 4/1991 Ratnakumar
6,472,286 B1 10/2002 Yu
(Continued)

FOREIGN PATENT DOCUMENTS

TW I500156 B 9/2015
TW I563661 B 12/2016

OTHER PUBLICATIONS

Gendron et al., "Area-Efficient, Reduced and No-Snapback PNP-based ESD Protection in Advanced Smart Power Technology", Electrical Overstress/Electrostatic Discharge Symposium, 2006, 8 pages, IEEE.

(Continued)

*Primary Examiner* — Shahed Ahmed
*Assistant Examiner* — Khatib A Rahman
(74) *Attorney, Agent, or Firm* — Viering Jentschura & Partner mbB

(57) ABSTRACT

A semiconductor device includes a substrate; a collector including a buried layer within the substrate, a first well region over a first portion of the buried layer, and a first conductivity region at least partially within the first well region; a base including a second well region over a second portion of the buried layer and laterally adjacent to the first well region, and a second conductivity region at least partially within the second well region; an emitter including a third conductivity region at least partially within the second conductivity region; an isolation element between the first and the third conductivity regions; a conductive plate on the isolation element and electrically connected with the first conductivity region. The buried layer, the first well region, the first and the third conductivity regions have a first conductivity type; the second well region and the second conductivity region have a second conductivity type.

18 Claims, 13 Drawing Sheets

(51) Int. Cl.
  *H01L 29/73* (2006.01)
  *H01L 29/66* (2006.01)

(56) References Cited

U.S. PATENT DOCUMENTS

| | | | |
|---|---|---|---|
| 7,968,936 B2 | 6/2011 | Denison et al. | |
| 8,878,283 B2 | 11/2014 | Denison et al. | |
| 9,018,705 B2* | 4/2015 | Hwang | H01L 29/732 |
| | | | 257/355 |
| 10,529,812 B1* | 1/2020 | Edwards | H01L 27/088 |
| 2012/0241900 A1* | 9/2012 | Chen | H01L 27/0259 |
| | | | 257/503 |
| 2014/0042544 A1* | 2/2014 | Karino | H01L 27/0248 |
| | | | 257/355 |
| 2014/0197491 A1* | 7/2014 | Yamaji | H01L 29/66659 |
| | | | 257/355 |
| 2014/0353799 A1* | 12/2014 | Hwang | H01L 29/732 |
| | | | 257/577 |
| 2015/0048451 A1* | 2/2015 | Chan | H01L 29/7816 |
| | | | 257/343 |
| 2018/0286853 A1* | 10/2018 | Mallikarjunaswamy | H01L 29/0649 |
| 2018/0323184 A1* | 11/2018 | Hung | H01L 27/0259 |
| 2019/0103396 A1* | 4/2019 | Zhan | H01L 21/84 |
| 2019/0103498 A1* | 4/2019 | Pang | H01L 29/36 |

OTHER PUBLICATIONS

Cha et al., "0.18 μm 100V-rated BCD with Large Area Power LDMOS with ultra-low effective Specific Resistance", Proceedings of 2016 28th International Symposium on Power Semiconductor Devices and ICs (ISPSD), Jun. 2016, pp. 423-426, IEEE.

Renaud et al., "High robustness PNP-based structure for the ESD protection of high voltage I/Os in an advanced smart power technology", Bipolar/BiCMOS Circuits and Technology Meeting, 2007, pp. 226-229, IEEE.

Zhu et al., "Implementation of High-Side, High-Voltage RESURF LDMOS in a sub-half Micron Smart Power Technology", Proceedings of 2001 International Symposium on Power Semiconductor Devices & ICs, 2001, pp. 403-406, IEEE.

Khemka et al., "A Floating RESURF (FRESURF) LD-MOSFET Device Concept", IEEE Electron Device Letters, Oct. 2003, pp. 664-666, vol. 24, No. 10, IEEE.

Examination report from parallel TW patent application 109134159 dated Nov. 26, 2021, 6 pages (for reference purposes only).

* cited by examiner

SEMICONDUCTOR DEVICE AND METHOD OF FORMING THE SAME

TECHNICAL FIELD

The present disclosure relates generally to a semiconductor device and a method of forming a semiconductor device. In particular, the present disclosure relates to an electrostatic discharge (ESD) protection device and a method of forming the ESD protection device.

BACKGROUND

As integrated circuits continue to shrink in size, they become more sensitive to electrostatic discharge. It is important to protect a core circuit from ESD, using an ESD protection circuit connected with the core circuit.

Deep snapback ESD protection devices used for high voltage power clamps are likely to cause latch-up issues. Accordingly, non-snapback PNP based ESD protection devices can be used to provide latch-up free high voltage ESD protection.

FIG. 1A shows a cross-sectional view of a conventional PNP device 100 for ESD protection, and FIG. 1B shows an equivalent circuit 150 of the conventional PNP device 100. As shown in FIG. 1A, an n-type buried layer (NBL) 104 and an n-type epitaxial layer (N-Epi) 106 are arranged within a p-substrate (P-Sub) 102, forming a base region of the PNP device 100 along with Nwells 108 arranged within the N-Epi layer 106. An emitter region 120 of the PNP device 100 includes P+ regions 122 arranged within the Nwells 108. N+ regions 112 are also arranged within the Nwells 108, forming a resistor 110 connected between the base region and the emitter region 120 of the PNP device 100, as shown in FIG. 1B. A collector region 130 includes a Pwell 132 arranged within the N-Epi layer 106 and a P+ region 134 arranged within the Pwell 132. The conventional PNP device 100 offers latch-up free ESD protection; whereas, high turn-on resistance and low failure current may be exhibited.

SUMMARY

According to various non-limiting embodiments, there may be provided a semiconductor device. The semiconductor device may include a substrate and a collector region arranged within the substrate. The collector region may include a buried layer arranged within the substrate, a first well region arranged over a first portion of the buried layer, and a first conductivity region arranged at least partially within the first well region. The semiconductor device may further include a base region arranged over a second portion of the buried layer where the base region may include a second well region arranged over the second portion of the buried layer and a second conductivity region arranged at least partially within the second well region, and where the first well region may be laterally adjacent to the second well region. The semiconductor device may further include an emitter region including a third conductivity region arranged at least partially within the second conductivity region, an isolation element may be arranged between the first conductivity region and the third conductivity region, and a conductive plate may be arranged on the isolation element and electrically connected with the first conductivity region. The buried layer, the first well region, the first conductivity region, and the third conductivity region may have a first conductivity type, and the second well region and the second conductivity region may have a second conductivity type different from the first conductivity type.

According to various non-limiting embodiments, there may be provided a method of forming a semiconductor device. The method may include providing a substrate, forming a buried layer within the substrate, forming a first well region over a first portion of the buried layer, forming a first conductivity region at least partially within the first well region to form a collector region including the buried layer, the first well region and the first conductivity region. The method may include forming a second well region over a second portion of the buried layer where the first well region may be laterally adjacent to the second well region, forming a second conductivity region at least partially within the second well region to form a base region including the second well region and the second conductivity region, forming a third conductivity region at least partially within the second conductivity region to form an emitter region, forming an isolation element between the first conductivity region and the third conductivity region, and forming a conductive plate on the isolation element and electrically connecting the conductive plate with the first conductivity region. The buried layer, the first well region, the first conductivity region, and the third conductivity region may have a first conductivity type. The second well region and the second conductivity region may have a second conductivity type different from the first conductivity type.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1A:
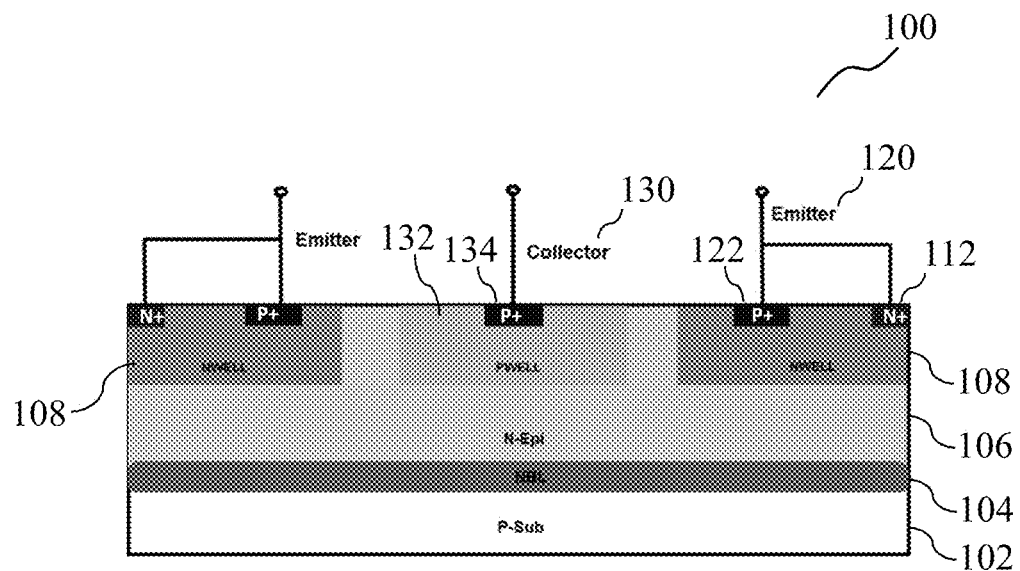
FIG. 1A shows a cross-sectional view of a conventional PNP device for ESD protection.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

The term "connected" (or "coupled") herein, when used to refer to two physical elements, means a direct connection between the two physical elements or a connection through one or more intermediary elements.

It should be understood that the terms "on", "over", "under", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The non-limiting embodiments described below in context of the devices are analogously valid for the respective methods, and vice versa. Furthermore, it will be understood that the embodiments described below may be combined; for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

Various non-limiting embodiments relate to a semiconductor device, for example, an electrostatic discharge (ESD) protection device, such as a bipolar junction transistor (BJT) based ESD protection device.

Figure 2:
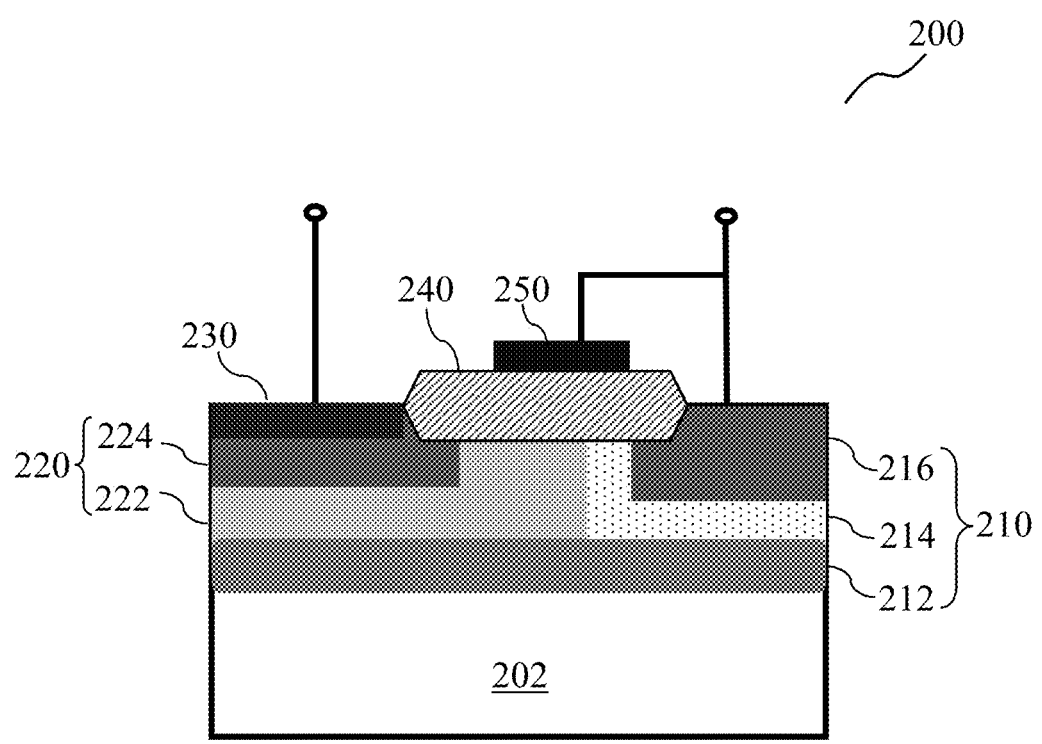
FIG. 2 shows a cross-sectional view of a semiconductor device according to various non-limiting embodiments.

FIG. 2 shows a cross-sectional view of a semiconductor device 200 according to various non-limiting embodiments.

As shown in FIG. 2, the semiconductor device may include a substrate 202, and a collector region 210 arranged within the substrate 202. The collector region 210 may include a buried layer 212 arranged within the substrate 202, a first well region 214 arranged over a first portion of the buried layer 212, and a first conductivity region 216 arranged at least partially within the first well region 214. The semiconductor device 200 may further include a base region 220 arranged over a second portion of the buried layer 212. The base region may include a second well region 222 arranged over the second portion of the buried layer 212, and a second conductivity region 224 arranged at least partially within the second well region 222. The first well region 214 may be laterally adjacent to the second well region 222. The semiconductor device 200 may further include an emitter region including a third conductivity region 230 arranged at least partially within the second conductivity region 224. An isolation element 240 may be arranged between the first conductivity region 216 and the third conductivity region 230. A conductive plate 250 may be arranged on the isolation element 240, wherein the conductive plate 250 may be electrically connected with the first conductivity region 216. The buried layer 212, the first well region 214, the first conductivity region 216, and the third conductivity region 230 have a first conductivity type. The second well region 222 and the second conductivity region 224 have a second conductivity type different from the first conductivity type.

According to various non-limiting embodiments, the collector region 210, the base region 220 and the emitter region form a transistor, e.g. a bipolar junction transistor (BJT).

According to various non-limiting embodiments, the first conductivity type may be one of P-type or N-type, and the second conductivity type may be different from the first conductivity type, i.e. N-type or P-type, respectively. In a non-limiting embodiment where the first conductivity type is P-type and the second conductivity type is N-type, the collector region 210, the base region 220 and the emitter region may form a PNP transistor. In an alternative non-limiting embodiment where the first conductivity type is N-type and the second conductivity type is P-type, the collector region 210, the base region 220, and the emitter region may form a NPN transistor.

According to various non-limiting embodiments, the substrate 202 may include a material, such as but not limited to, silicon (Si), germanium (Ge), silicon carbide (SiC), gallium arsenide (GaAs), gallium nitride (GaN), or combinations thereof, or any other suitable semiconductor material. According to a non-limiting embodiment, the substrate 202 may include single crystal silicon. According to various non-limiting embodiments, the substrate 202 may include a semiconductor-on-insulator substrate, such as but not limited to a silicon-on-insulator (SOI), a germanium-on-insulator (GeOI) substrate, a SiC-on-insulator (SiCOI) substrate, a GaAs-on-insulator (GaAsOI) substrate, a GaN-on-insulator (GaNOI) substrate, or combinations thereof, or any other suitable semiconductor-on-insulator substrate.

According to various embodiments, the substrate 202 may be lightly doped, e.g. with a doping concentration in a range from about $1E15$ $cm^{-3}$ to about $1E16$ $cm^{-3}$.

According to various non-limiting embodiments, the isolation element 240 may be provided to space the first conductivity region 216 apart from the third conductivity region 230. The isolation element 240 may be at least partially arranged in the substrate 202. In various non-limiting embodiments, the isolation element 240 may be at least partially arranged over the first well region 214 and the base region 220. In various non-limiting embodiments, the isolation element 240 may be in contact with a top surface of the first well region 214, a top surface of the second well region 222, and/or a top surface of the second conductivity region 224.

According to various non-limiting embodiments, the isolation element 240 may be at least partially arranged over a p-n junction formed between the first well region 214 and the second well region 222.

In various non-limiting embodiments, the isolation element 240 may include at least one of a local oxidation of silicon (LOCOS) isolation, a shallow trench isolation (STI), or a field oxide deposition (FOD) isolation. In a non-limiting example, the LOCOS isolation may include silicon oxide. In a non-limiting example, the STI may include silicon nitride. In a non-limiting example, the FOD isolation may include silicon oxide.

According to various non-limiting embodiments, the conductive plate 250 may be at least partially arranged over a p-n junction formed between the first well region 214 and the second well region 222. In other words, the conductive plate may be at least partially overlapping or bridged over the p-n junction formed between the first well region 214 and the second well region 222, with the isolation element 240 arranged inbetween. The conductive plate 250, which may also be referred to as a field plate, may include a conductive material, such as but not limited to polysilicon or metal.

According to various non-limiting embodiments, the conductive plate 250, the isolation element 240, the second well region 222 and the buried layer 212 may form a reduced surface field (RESURF) structure, which can sustain high breakdown voltage of the transistor. The RESURF structure may help to minimize the lateral dimension, i.e. the width, of the second well region 222, leading to the turn-on resistance of the semiconductor device 200 to be as small as possible.

According to various non-limiting embodiments, a terminal contact may be absent from the base region 220, such that the base region 220 is configured to be floating. In other words, no contact pad, which may be configured to receive a voltage bias externally, is formed in the base region 220.

In various non-limiting embodiments, the first conductivity region 216 may include a third well region (not shown in FIG. 2) and a terminal region (not shown in FIG. 2) arranged at least partially within the third well region. The terminal region may have a higher doping concentration than the third well region. In various non-limiting embodiments, the terminal region may have a doping concentration in a range from about $5E19$ $cm^{-3}$ to about $5E20$ $cm^{-3}$. The third well region may have a doping concentration in a range from about $1E17$ $cm^{-3}$ to about $1E19$ $cm^{-3}$.

In various non-limiting embodiments, the first conductivity region 216 may have a higher doping concentration than the first well region 214. The first well region 214 may form a drift region of the semiconductor device 200. In various non-limiting embodiments, the first well region 214 may have a doping concentration in a range from about $1E16$ $cm^{-3}$ to about $5E17$ $cm^{-3}$.

In various non-limiting embodiments, the second conductivity region 224 may have a higher doping concentration than the second well region 222. The second well region 222 may form a drift region of the semiconductor device 200. In various non-limiting embodiments, the second conductivity region 224 may have a doping concentration in a range from about $1E17$ $cm^{-3}$ to about $1E18$ $cm^{-3}$. The second well region 222 may have a doping concentration in a range from about $1E16$ $cm^{-3}$ to about $1E17$ $cm^{-3}$.

According to various non-limiting embodiments, the first well region 214 may be in contact with the buried layer 212. In other words, the first well region 214 may be arranged on a top surface of the buried layer 212. According to various non-limiting embodiments, the second well region 222 may be entirely arranged on the buried layer 212, and may be in contact with the buried layer 212. The buried layer 212 may extend horizontally under the first well region 214 and the second well region 222.

In various non-limiting embodiments, the buried layer 212 and the second well region 222 may have comparable doping concentrations. In other words, the doping concentration of the buried layer 212 may be similar to, e.g. on the same order as, the doping concentration of the second well region 222. In various non-limiting embodiments, the doping concentrations of the buried layer 212 and the second well region 222 may be the same. In various non-limiting embodiments, the buried layer 212 has a doping concentration in a range from about $1E16$ $cm^{-3}$ to about $1E17$ $cm^{-3}$, and the second well region 222 has a doping concentration in a range from about $1E16$ $cm^{-3}$ to about $1E17$ $cm^{-3}$.

In various non-limiting embodiments, the third conductivity region 230 may have a doping concentration in a range from about $5E19$ $cm^{-3}$ to about $5E20$ $cm^{-3}$.

According to various non-limiting embodiments, the first well region 214 and the first conductivity region 216 are arranged at least partially surrounding the second well region 222, the second conductivity region 224, and the third conductivity region 230, as described in more detail with reference to FIG. 3-FIG. 6B below. In the non-limiting embodiments shown in FIG. 2, the first well region 214 and the first conductivity region 216 are shown at the lateral side of the second well region 222, the second conductivity region 224, and the third conductivity region 230 in a cross-sectional view. This may include the embodiments wherein the first well region 214 and the first conductivity region 216 are arranged side by side with the second well region 222, the second conductivity region 224, and the third conductivity region 230; or may include the embodiments where the first well region 214 and the first conductivity region 216 are arranged at least partially surrounding the second well region 222, the second conductivity region 224, and the third conductivity region 230.

According to various non-limiting embodiments, the first well region 214 and the first conductivity region 216 may be arranged at a first side of the second well region 222 where a further first well region (not shown in FIG. 2) and a further first conductivity region (not shown in FIG. 2) may be arranged at a second side of the second well region 222, as will be described in more detail with reference to FIG. 3 below. The first side may be opposite to the second side. The buried layer 212 may extend horizontally under the first well region 214 and the second well region 222 so as to connect the first well region 214 to the further first well region.

Figure 5:
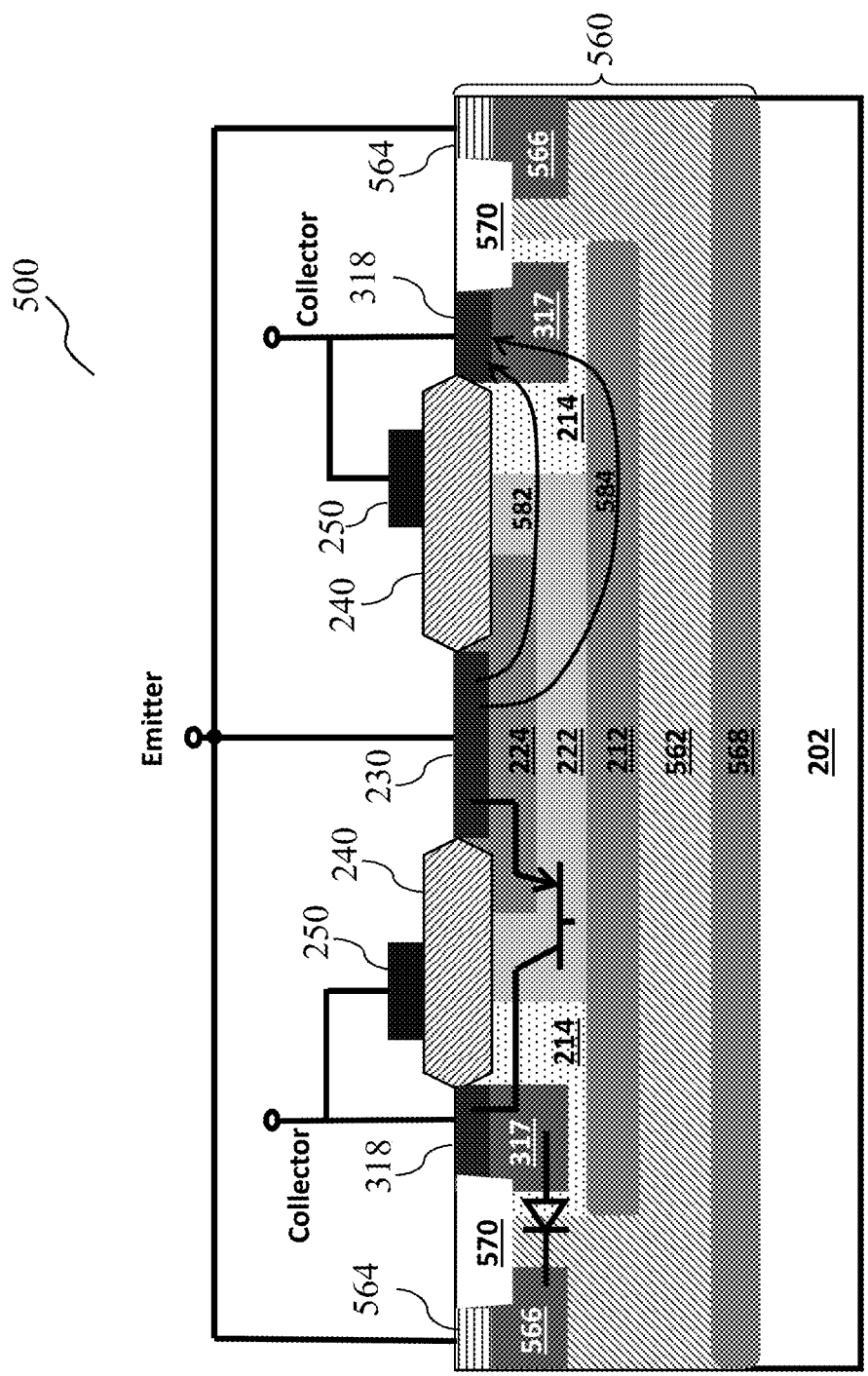
FIG. 5 shows a cross-sectional view of a semiconductor device according to various non-limiting embodiments.
Figure 6A:
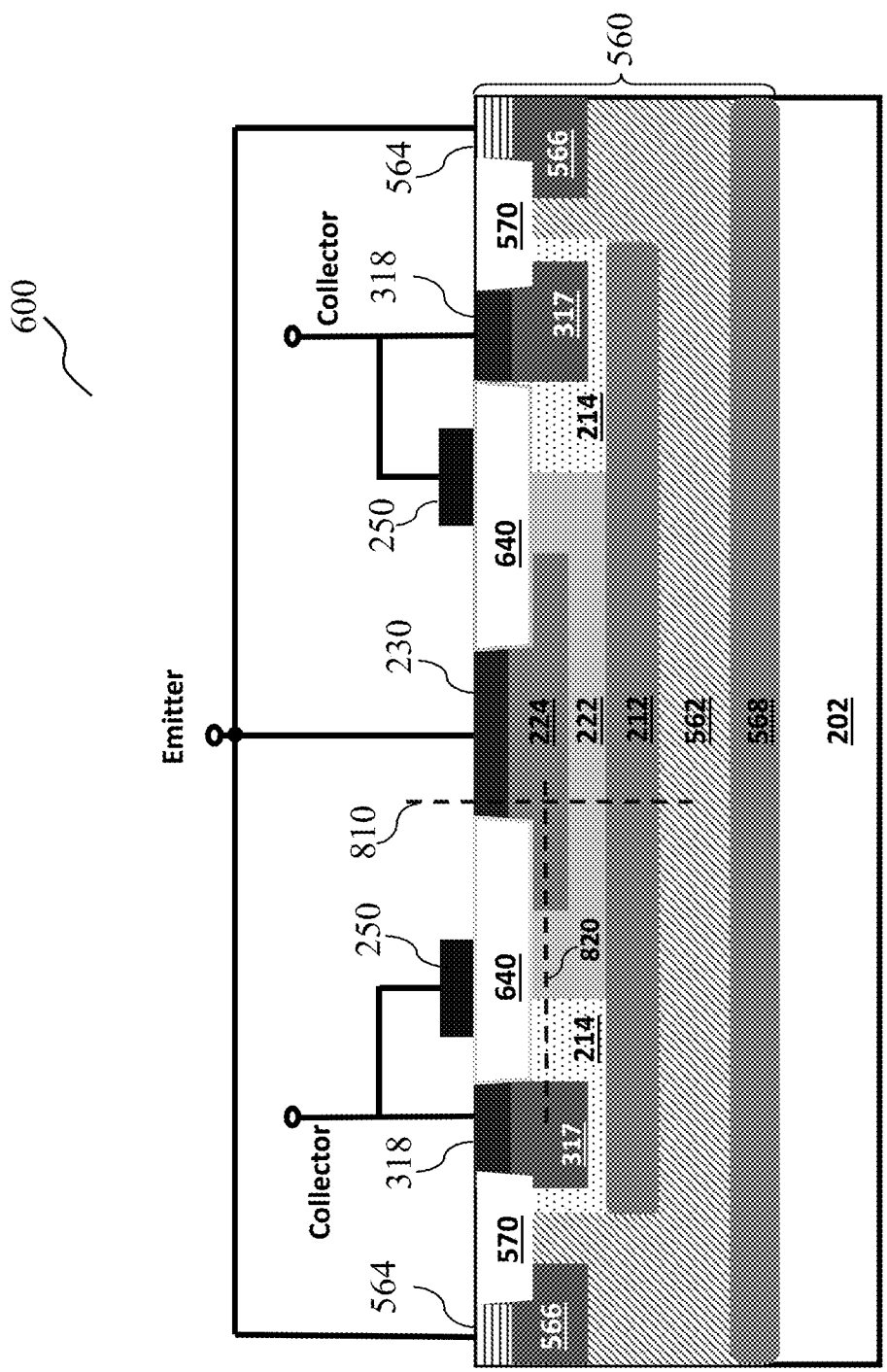
FIG. 6A shows a cross-sectional view of a semiconductor device according to various non-limiting embodiments.
Figure 6B:
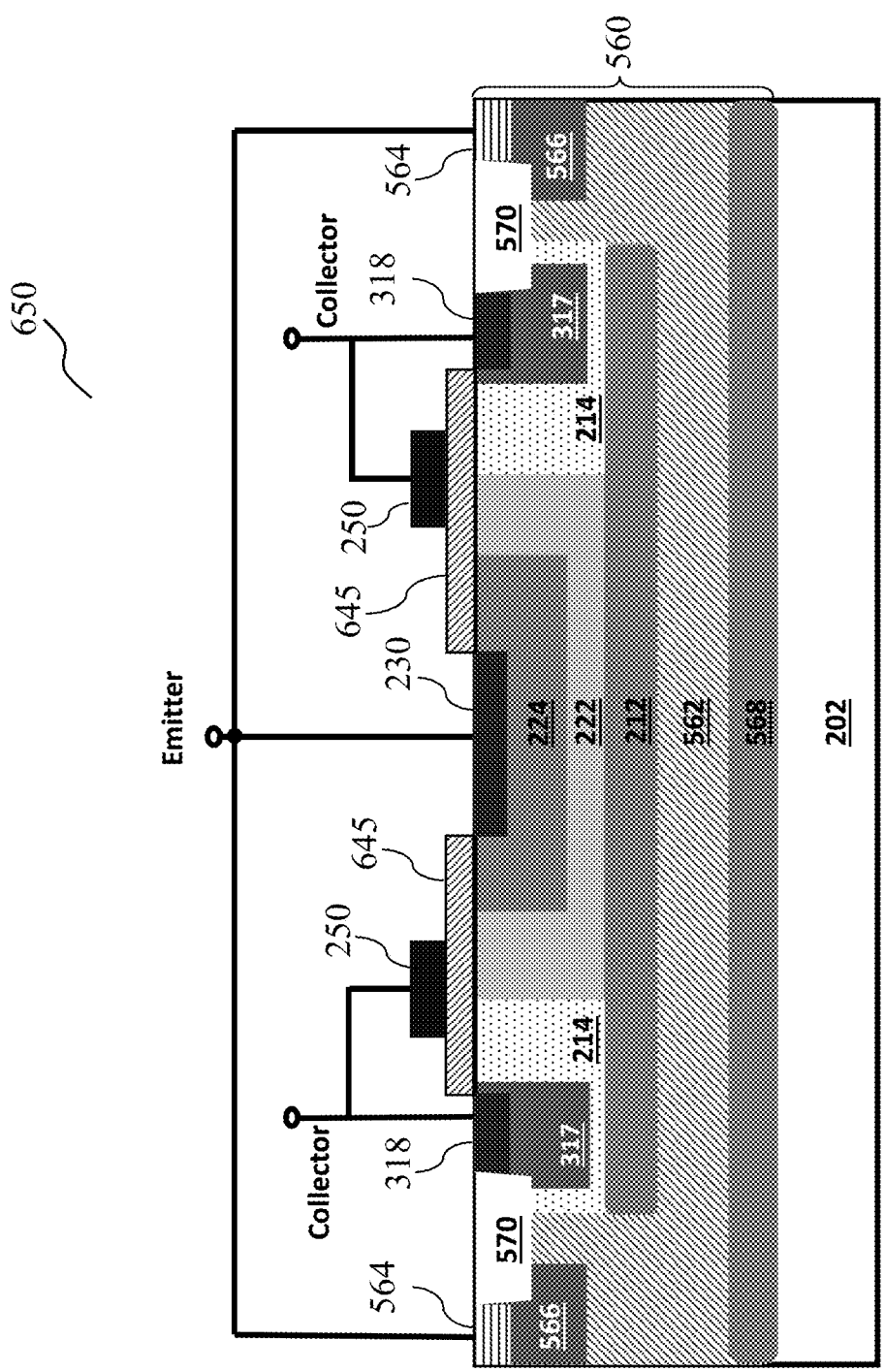
FIG. 6B shows a cross-sectional view of a semiconductor device according to various non-limiting embodiments.

According to various non-limiting embodiments, the semiconductor device 200 may further include a fourth conductivity region (not shown in FIG. 2) arranged within the substrate 202, as shown in FIG. 5, FIG. 6A and FIG. 6B below. The fourth conductivity region may be arranged at least partially under the buried layer 212 and at least partially surrounding the first well region 214 and the first conductivity region 216 where the fourth conductivity region has the second conductivity type. The first well region 214, the first conductivity region 216, and the fourth conductivity region may form a diode.

In various non-limiting embodiments, the fourth conductivity region may include an epitaxial layer and a terminal region arranged at least partially within the epitaxial layer. The terminal region may have a higher doping concentration than the epitaxial layer. In various non-limiting embodiments, the terminal region may have a doping concentration in a range from about 5E19 cm$^{-3}$ to about 5E20 cm$^{-3}$. The epitaxial layer may have a doping concentration in a range from about 5E15 cm$^{-3}$ to about 5E16 cm$^{-3}$.

In various non-limiting embodiments, the terminal region of the fourth conductivity region may be electrically connected with the third conductivity region 230 where the terminal region of the fourth conductivity region may be spaced apart from the first conductivity region 216 via a further isolation element (not shown in FIG. 2). Accordingly, the diode formed by the fourth conductivity region, the first well region 214, and the first conductivity region 216 may be connected in parallel with the transistor formed by the collector region 210, the base region 220, and the emitter region, and may create a current path between the collector 210 and the emitter 230.

According to various non-limiting embodiments, the first conductivity region 216 may be biased at a first voltage, and the third conductivity region 230 may be biased at a second voltage different from the first voltage. In an non-limiting embodiment where the semiconductor device 200 includes the PNP transistor, the second voltage may be higher than the first voltage. In a non-limiting embodiment where the semiconductor device 200 may include the NPN transistor, the second voltage may be lower than the first voltage. When a difference between the first voltage and the second voltage exceeds a predetermined threshold, e.g., a breakdown voltage of the transistor, the semiconductor device 200 may be configured such that a first current passes laterally between the third conductivity region 230 and the first conductivity region 216 through the second conductivity region 224, the second well region 222 and the first well region 214, and a second current passes vertically between the third conductivity region 230 and the first conductivity region 216 through the second conductivity region 224, the second well region 222, the buried layer 212 and the first well region 214. In the non-limiting embodiment where the semiconductor device 200 includes the PNP transistor, the first current passes laterally from the third conductivity region 230 towards the first conductivity region 216, through the second conductivity region 224, the second well region 222, and the first well region 214 in this order; and the second current passes vertically from the third conductivity region 230 towards the first conductivity region 216 through the second conductivity region 224, the second well region 222, the buried layer 212 and the first well region 214 in this order. In a non-limiting embodiment where the semiconductor device 200 includes the NPN transistor, the first current may pass laterally from the first conductivity region 216 towards the third conductivity region 230, through the first well region 214, the second well region 222 and the second conductivity region 224 in this order; and the second current may pass vertically from the first conductivity region 216 towards the third conductivity region 230 through the first well region 214, the buried layer 212, the second well region 222, and the second conductivity region 224 in this order.

According to various non-limiting embodiments, the semiconductor device 200 may be an electrostatic discharge (ESD) protection device.

Figure 3:
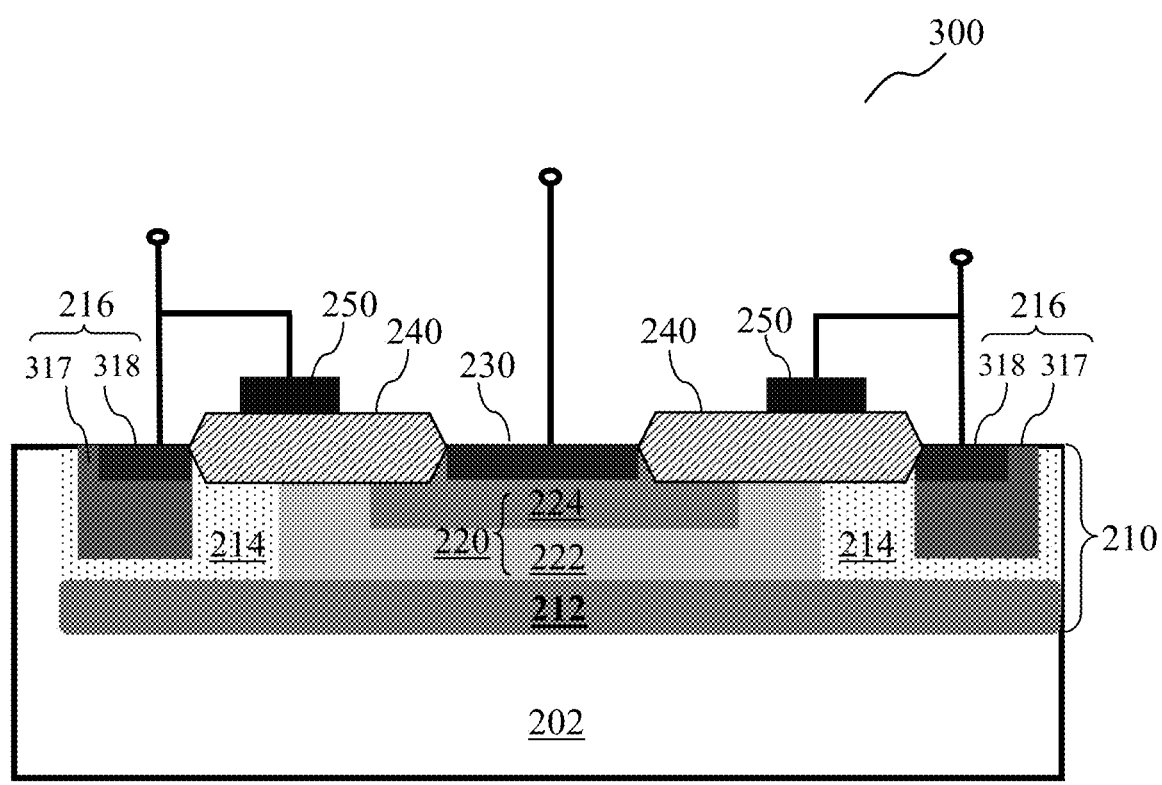
FIG. 3 shows a cross-sectional view of a semiconductor device according to various non-limiting embodiments.
Figure 4:
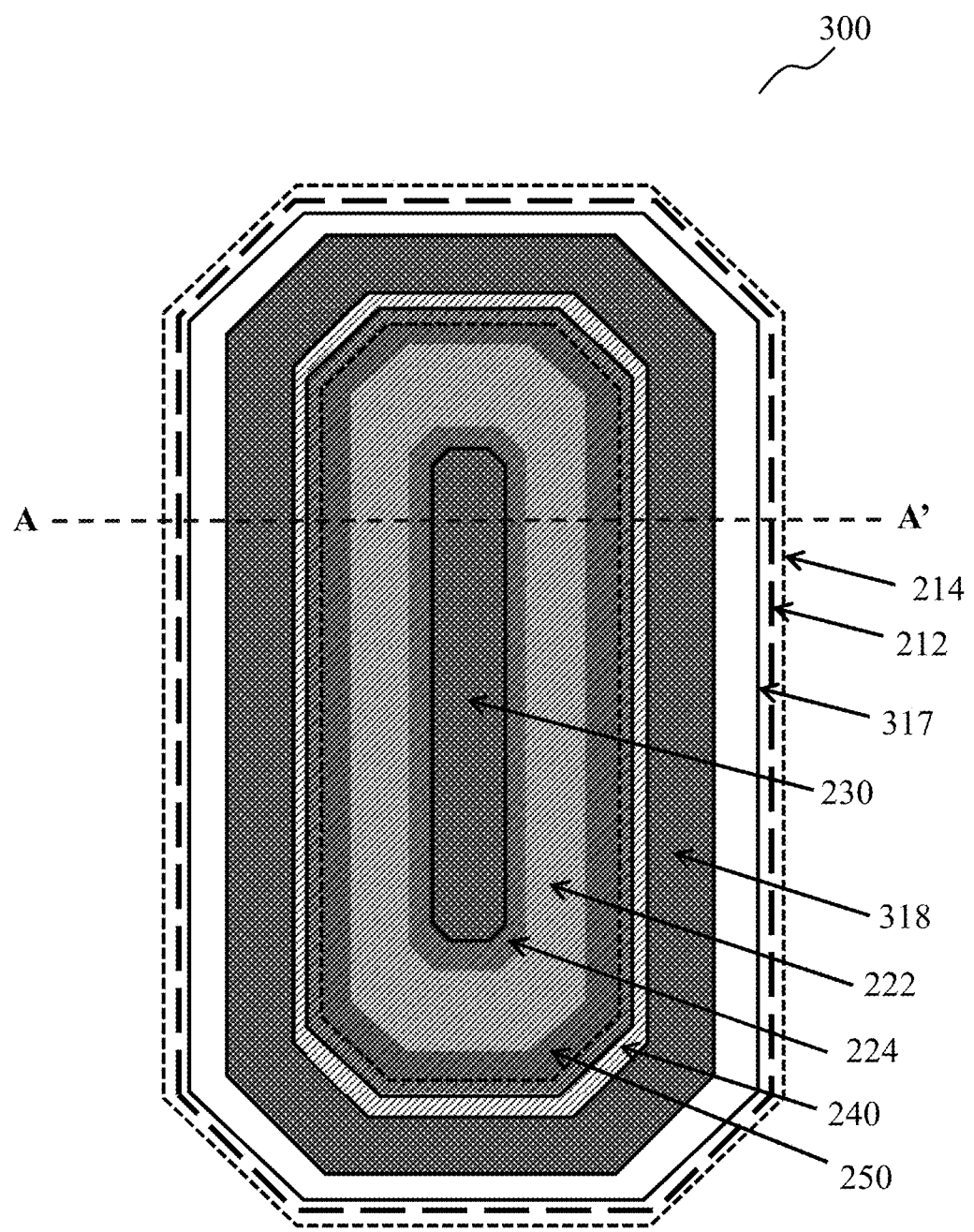
FIG. 4 shows a top view of the semiconductor device of FIG. 3 according to various non-limiting embodiments.

FIG. 3 shows a cross-sectional view of a semiconductor device 300 along line A-A' of FIG. 4 according to various non-limiting embodiments, and FIG. 4 shows a top view of the semiconductor device 300 according to various non-limiting embodiments.

The semiconductor device 300 is similar to the semiconductor device 200 of FIG. 2, and thus the common features are labeled with the same reference numerals. Various embodiments described with reference to FIG. 2 are analogously valid for the semiconductor device 300 of FIG. 3 and FIG. 4, and vice versa.

Similar to the semiconductor device 200, the semiconductor device 300 may include the substrate 202, and the collector region 210 arranged within the substrate 202. The collector region 210 may include the buried layer 212 arranged within the substrate 202, the first well region 214 arranged over the first portion of the buried layer 212, and the first conductivity region 216 arranged at least partially within the first well region 214.

In various non-limiting embodiments shown in FIG. 3, the first conductivity region 216 may include a third well region 317 and a terminal region 318 arranged at least partially within the third well region 317. The terminal region 318 may have a higher doping concentration than the third well region 317. In various non-limiting embodiments, the terminal region 318 may have a doping concentration in a range from about 5E19 cm$^{-3}$ to about 5E20 cm$^{-3}$. The third well region 317 may have a doping concentration in a range from about 1E17 cm$^{-3}$ to about 1E19 cm$^{-3}$.

Similar to the semiconductor device 200, the semiconductor device 300 may further include the base region 220 arranged over the second portion of the buried layer 212, where the base region 220 may include the second well region 222 arranged over the second portion of the buried layer 212 and the second conductivity region 224 may be arranged at least partially within the second well region 222. The first well region 214 may be laterally adjacent to the second well region 222. The semiconductor device 300 may further include an emitter region including the third conductivity region 230 arranged at least partially within the second conductivity region 224. The isolation element 240 may be arranged between the first conductivity region 216 and the third conductivity region 230. The conductive plate 250 may be arranged on the isolation element 240 where the conductive plate 250 may be electrically connected with the first conductivity region 216. The buried layer 212, the first well region 214, the third well region 317, the terminal region 318, and the third conductivity region 230 may have the first conductivity type. The second well region 222 and the second conductivity region 224 may have the second conductivity type different from the first conductivity type.

Different from the embodiments shown in FIG. 2, the semiconductor device 300 is shown to have the first well region 214 and the first conductivity region 216 arranged at two sides (e.g. left side and right side) of the second well region 222, the second conductivity region 224, and the third conductivity region 230.

In various non-limiting embodiments, the first well region 214 and the first conductivity region 216 may be arranged substantially surrounding (e.g., at least half surrounding) the second well region 222, the second conductivity region 224, and the third conductivity region 230. FIG. 4 shows the top view of the non-limiting embodiments where the first well region 214 and the first conductivity region 216 are entirely surrounding the second well region 222, the second conductivity region 224, and the third conductivity region 230. The isolation element 240 and the conductive plate 250 may also be entirely surrounding the third conductivity region 230, as shown in the non-limiting embodiments of FIG. 4.

FIG. 4 shows a non-limiting embodiment where the semiconductor device 300 is in an octagonal shape. It is understood that the semiconductor device 300 may be provided in any other suitable shape or layout in various non-limiting embodiments, such as but not limited to, a rectangular shape, a circular shape, or a rounded rectangular shape (e.g., similar to the shape of a racetrack).

In various non-limiting embodiments, the first well region 214 and the first conductivity region 216 may be arranged at a first side (e.g., right side as shown in FIG. 3) of the second well region 222 where a further first well region 214 and a further first conductivity region 216 may be arranged at a second side (e.g., left side as shown in FIG. 3) of the second well region 222. The first side may be opposite to the second side. Accordingly, the first well region 214 at the first side and the further first well region 214 at the second side may be two separate regions, and the first conductivity region 216 at the first side and the further first conductivity region 216 at the second side may be two separate regions. The buried layer 212 may extend horizontally under the first well region 214 and the second well region 222, so as to connect the first well region 214 at the first side to the further first well region 214 at the second side. A further isolation element 240 may also be arranged between the third conductivity region 230 and the further first conductivity region 216 at the second side, and a further conductive plate 250 may be arranged on the further isolation element 240.

Compared with the semiconductor device 200, the semiconductor device 300 of FIG. 3 may provide non-limiting embodiments of a dual-side transistor structure, in which the collector region 210, may be arranged at two sides of the base region 220 and the emitter region, or may be arranged to surround the periphery of the base region 220.

FIG. 5 shows a cross-sectional view of a semiconductor device 500 according to various non-limiting embodiments.

The semiconductor device 500 is similar to the semiconductor device 200 of FIG. 2 and the semiconductor device 300 of FIG. 3, and thus the common features are labeled with the same reference numerals. Various embodiments described with reference to FIG. 2 and FIG. 3 are analogously valid for the semiconductor device 500 of FIG. 5, and vice versa.

As shown in FIG. 5, the semiconductor device 500 may have a dual-side structure similar to the embodiments of FIG. 3, in which the collector region 210 may be arranged at two sides of the base region 220 and the emitter region, or may be arranged to surround the periphery of the base region 220.

For illustration purposes, the first conductivity type may be P-type and the second conductivity type may be N-type in the following description; however, in non-limiting embodiments, the semiconductor device 500 may have N-type for the first conductivity type and P-type for the second conductivity type. Accordingly, the collector region 210, the base region 220, and the emitter region may form a PNP transistor. The buried layer 212 may be a P-type buried layer (referred to as PBL herewith), and the first well region 214 may be a P-type region that may form a P-type drift region (referred to as P-Drift region herewith). The third well region 317 may be a P-type well region (referred to as PWell region herewith), and the terminal region 318 may be a P-type terminal region (referred to as P+ terminal region herewith). Similarly, the third conductivity region 230 may be a P-type region (referred to as P+ emitter region herewith). The second well region 222 may be a N-type region that may form a N-type drift region (referred to as N-Drift region herewith), and the second conductivity region 224 may be a N-type region (referred to as NWell1 region herewith). The base region 210 including the N-Drift region 222 and the NWell1 224 may be provided without a terminal contact, such that the base region 210 may be configured to be floating.

It is understood that the first conductivity type and the second conductivity type may be reversed in alternative non-limiting embodiments where the collector region 210, the base region 220 and the emitter region may form a NPN transistor. Accordingly, the P-type and N-type for various regions/elements as described above may be reversed.

Compared with the non-limiting embodiments of FIG. 2 and FIG. 3, the semiconductor device 500 may further include a fourth conductivity region 560 arranged within the substrate 202. The fourth conductivity region 560 may be arranged at least partially under the buried layer 212 and at least partially surrounding the first well region 214 and the first conductivity region 216 (including the third well region 317 and the terminal region 318). The fourth conductivity region 560 has the second conductivity type, i.e. N-type as described in the following non-limiting embodiments. The first well region 214, the third well region 317 and the fourth conductivity region 560 may form a diode, as depicted in FIG. 5.

In various non-limiting embodiments, the fourth conductivity region 560 may include an epitaxial layer 562 (e.g. N-type epitaxial layer, referred to as N-Epi layer herewith) and a terminal region 564 (e.g. N+ region, referred to as N+ terminal region herewith) arranged at least partially within the epitaxial layer 562. The terminal region 564 may have a higher doping concentration than the epitaxial layer 562. In various non-limiting embodiments, the terminal region 564 may have a doping concentration in a range from about 5E19 $cm^{-3}$ to about 5E20 $cm^{-3}$. The epitaxial layer 562 may have a doping concentration in a range from about 5E15 $cm^{-3}$ to about 5E16 $cm^{-3}$.

In various non-limiting embodiments, the terminal region 564 of the fourth conductivity region 560 may be electrically connected with the third conductivity region 230 where the terminal region 564 of the fourth conductivity region 560 is spaced apart from the first conductivity region 216 via a further isolation element 570. The further isolation element 570 may include a shallow trench isolation (STI) as shown in the non-limiting embodiments of FIG. 5, or may include a local oxidation of silicon (LOCOS) isolation (not shown in FIG. 5), or may include or a field oxide deposition (FOD) isolation (not shown in FIG. 5).

In various non-limiting embodiments, the fourth conductivity region 560 may optionally include a fourth well region 566 arranged at least partially within the epitaxial layer 562 and surrounding the terminal region 564. The fourth well region 566 may be a N-type region (referred to as NWell2 region herewith) having a doping concentration lower than the terminal region 564. In various non-limiting embodiments, the fourth well region 566 may have a doping concentration in a range from about $1E16$ cm$^{-3}$ to about $1E19$ cm$^{-3}$.

In various non-limiting embodiments, the fourth conductivity region 560 may optionally include a further buried layer 568 arranged under the epitaxial layer 562. The further buried layer 568 may be a N-type buried layer (referred to as NBL herewith). In various non-limiting embodiments, the NBL 568 may have a doping concentration in a range from about $5E16$ cm$^{-3}$ to about $5E19$ cm$^{-3}$.

According to various non-limiting embodiments, the parasitic diode formed by the fourth conductivity region 560, the first well region 214 and the third well region 317 is connected in parallel with the transistor formed by the collector region 210, the base region 220 and the emitter region, and may create a current path between the collector 210 and the emitter 230.

In various non-limiting embodiments of FIG. 2 and FIG. 3 without the fourth conductivity region 560, the substrate 202 may have the second conductivity type, i.e. the N-type substrate (referred to as N-sub). In various embodiments of FIG. 5 with the fourth conductivity region 560, the substrate 202 may have the first conductivity type, i.e. the P-type substrate (referred to as P-sub). The substrate 202 may have a doping concentration in a range from about $1E15$ cm$^{-3}$ to about $1E16$ cm$^{-3}$.

According to various non-limiting embodiments, the isolation element 240 may be at least partially arranged over the first well region 214 and the base region 220. In various non-limiting embodiments, the isolation element 240 may be in contact with a top surface of the first well region 214, a top surface of the second well region 222, and/or a top surface of the second conductivity region 224.

According to various non-limiting embodiments, the isolation element 240 may be at least partially arranged over the p-n junction formed between the P-Drift region 214 and the N-Drift region 222.

In various non-limiting embodiments, the isolation element 240 may include a LOCOS isolation as shown in the non-limiting embodiments of FIG. 5.

FIG. 6A shows a cross-sectional view of a semiconductor device 600 according to various non-limiting embodiments. The semiconductor device 600 is similar to the semiconductor device 500 of FIG. 5, and thus the common features are labeled with the same reference numerals. Various embodiments described with reference to FIG. 5 are analogously valid for the semiconductor device 600 of FIG. 6A, and vice versa.

As shown in FIG. 6A, the semiconductor device 600 is similar to the semiconductor device 500, except that the isolation element 640 arranged between the third conductivity region 230 and the terminal region 318 of the first conductivity region may include a shallow trench isolation (STI). In FIG. 6A, a vertical cutline 810 is depicted, running through the P+ emitter region 230, the NWell1 region 224, the N-Drift region 222, the PBL 212 towards the N-Epi layer 562. A horizontal cutline 820 is further depicted, running through the PWell region 317, the P-Drift region 214, the N-Drift region 222 and the NWell1 region 224. It is understood that the vertical cutline 810 and the horizontal cutline 820 may be similarly applied to the semiconductor devices 200, 300, 500 above. Exemplary doping profiles along the vertical cutline 810 and the horizontal cutline 820 will be described with reference to FIG. 8A and FIG. 8B below.

FIG. 6B shows a cross-sectional view of a semiconductor device 650 according to various non-limiting embodiments. The semiconductor device 650 is similar to the semiconductor device 500 of FIG. 5 and the semiconductor device 600 of FIG. 6A, and thus the common features are labeled with the same reference numerals. Various embodiments described with reference to FIG. 5 and FIG. 6A are analogously valid for the semiconductor device 650 of FIG. 6B, and vice versa.

As shown in FIG. 6B, the semiconductor device 650 is similar to the semiconductor device 500, 600, except that the isolation element 645 arranged between the third conductivity region 230 and the terminal region 318 of the first conductivity region may include a field oxide deposition (FOD) isolation. The FOD isolation 645 may be arranged on top of the substrate 202, for example, on the top surface of at least part of the base region and the collector region including the second conductivity region 224, the second well region 222, the first well region 214 and the third well region 317.

According to various non-limiting embodiments, the conductive plate 250 arranged on the isolation element 240, 640, 645 may be at least partially arranged over the p-n junction formed between the P-Drift region 214 and the N-Drift region 222. In other words, the conductive plate 250 may be at least partially overlapping or bridged over the p-n junction formed between the P-Drift region 214 and the N-Drift region 222, with the isolation element 240, 640, 645 arranged inbetween.

According to various non-limiting embodiments as shown in FIG. 5, FIG. 6A and FIG. 6B, the conductive plate 250, the isolation element 240, 640, 645, the N-Drift region 222 and the PBL 212 may form a RESURF structure capable of sustaining high breakdown voltage of the PNP transistor. The RESURF structure may also minimize the lateral dimension, i.e. the width, of the N-Drift region 222, thereby minimizing the turn-on resistance of the semiconductor device 500, 600, 650.

According to various non-limiting embodiments, the collector terminal region 318 may be biased at the first voltage, and the emitter terminal region 230 may be biased at the second voltage higher than the first voltage. When the difference between the first voltage and the second voltage exceeds a predetermined threshold, e.g., a breakdown voltage of the PNP transistor, the PNP transistor of the semiconductor device 500, 600, 650 is turned on. Accordingly, a first current path 582 may be generated, in which a first current may pass laterally from the P+ emitter region 230 towards the first conductivity region 216 of the collector (including the PWell region 317 and the P+ terminal region 318), through the NWell1 region 224, the N-Drift region 222 and the P-Drift region 214 in this order. A second current path 584 may be generated, in which a second current may pass vertically from the P+ emitter region 230 towards the first conductivity region 216 of the collector, through the NWell1 region 224, the -Drift region 222, the PBL 212 and the P-Drift region 214 in this order. The first current path 582 may be a lateral path, and the second current path 584 may be a vertical path, as illustrated in FIG. 5. When the emitter terminal 230 is biased at a higher voltage than the collector terminal 318 to turn on the PNP transistor, most of the voltage drops on the N-Drift region 222, as will be illustrated in FIG. 10 and FIG. 11 below.

It is understood that the current paths 582, 584 shown in FIG. 5 are corresponding to the non-limiting embodiments of the semiconductor device 500, 600, 650 including the PNP transistor. In various non-limiting embodiments wherein the NPN transistor is included in the semiconductor device 500, 600, 650, the P-type and N-type of the respective regions of the NPN transistor may be reversed as compared to the embodiments of the PNP transistor. In addition, the direction of the current paths 582, 584 may be reversed, and the voltage bias applied to the collector terminal region 318 and the emitter terminal region 230 may also be reversed. Illustratively, the collector terminal region 318 may be biased at the first voltage, and the emitter terminal region 230 may be biased at the second voltage lower than the first voltage. When the difference between the first voltage and the second voltage exceeds the predetermined threshold, e.g., the breakdown voltage of the NPN transistor, the NPN transistor of the semiconductor device 500, 600 is turned on. Accordingly, the first current may pass laterally from the first conductivity region 216 (including the Well region 317 and the N+ terminal region 318) towards the emitter N+ terminal region 230, through the N-Drift region 214, the P-Drift region 222 and the PWell1 region 224 in this order. The second current may pass vertically from the first conductivity region 216 towards the emitter N+ terminal region 230 through the N-Drift region 214, the N-type buried layer 212, the P-Drift region 222 and the PWell1 region 224 in this order. When the emitter terminal 230 is biased at a lower voltage than the collector terminal 318 to turn on the NPN transistor, most of the voltage drops on the P-Drift region 222.

According to various non-limiting embodiments as shown in FIG. 5, FIG. 6A and FIG. 6B, the N+ terminal region 564 of the fourth conductivity region 560 may be electrically connected to the emitter terminal region 230. The N-Epi region 562 of the fourth conductivity region 560, optionally along with the NWell2 region 566, form the parasitic diode with the P-Drift region 214 and the PWell region 317 of the collector to form a current path from the collector to the emitter as shown in FIG. 7.

Figure 7:
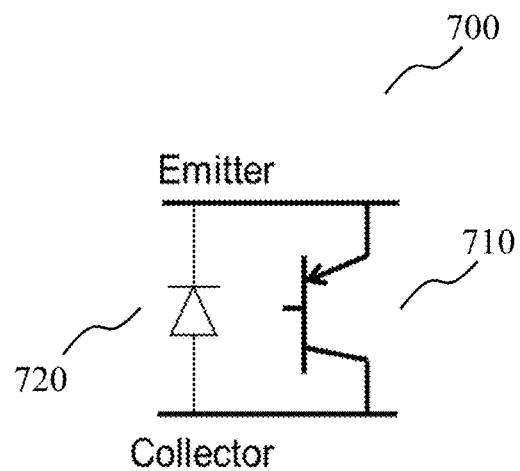
FIG. 7 shows an equivalent circuit of the semiconductor device of FIG. 5, FIG. 6A and FIG. 6B according to various non-limiting embodiments.

FIG. 7 shows an equivalent circuit 700 of the semiconductor device 500, 600, 650 of FIG. 5, FIG. 6A and FIG. 6B according to various non-limiting embodiments.

As shown in FIG. 7, the collector region 210, the base region 220 and the emitter region 230 form the PNP transistor 710. The fourth conductivity region 560 and the collector region 210 form the diode 720, which is connected in parallel with the PNP transistor 710.

Figure 8A:
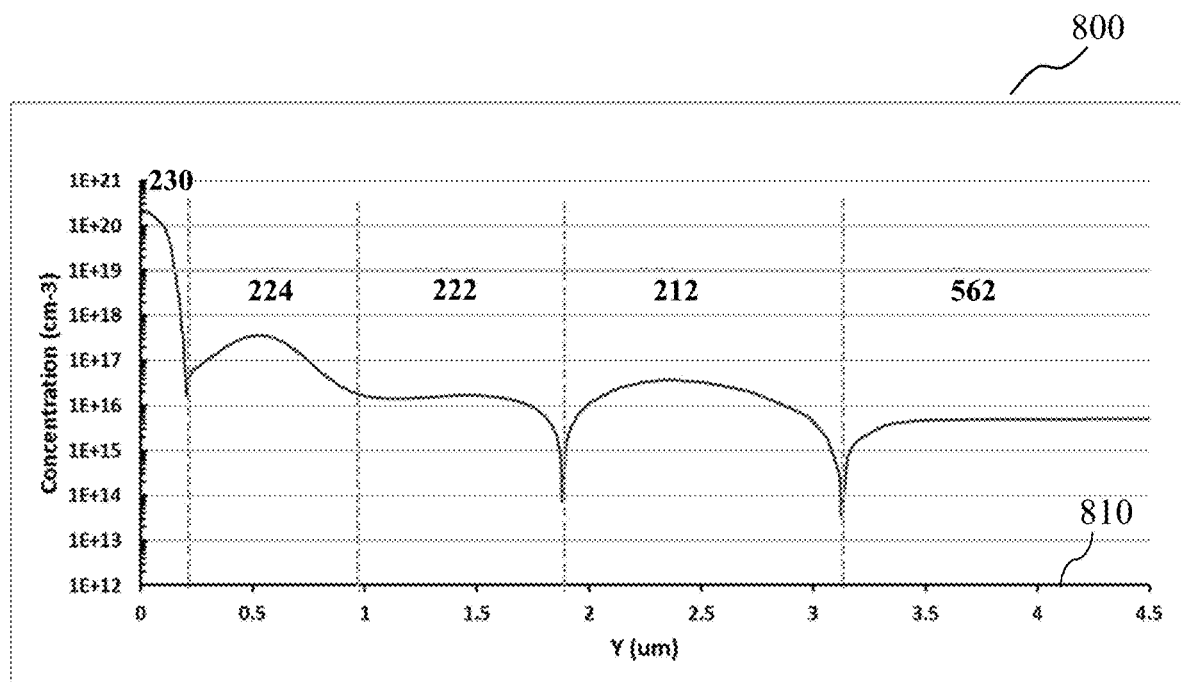
FIG. 8A shows an exemplary doping profile along a vertical cutline through a semiconductor device according to various embodiments.

FIG. 8A shows an exemplary doping profile 800 along the vertical cutline 810 through the semiconductor device 500, 600, 650 of FIG. 5, FIG. 6A and FIG. 6B according to various embodiments.

The doping profile 800 is illustrated along the vertical line from the P+ emitter region 230 towards the N-Epi layer 562, through the NWell1 region 224, the N-Drift region 222, and the PBL 212. As shown in FIG. 8A, the P+ emitter region 230 may be heavily doped at a doping concentration substantially higher than the NWell1 region 224. The NWell1 region 224 may have a higher doping concentration than the N-Drift region 222. The N-Drift region 222 may have a comparable doping concentration with the PBL 212, which may achieve high performance of the PNP transistor. The doping concentration of the N-Epi layer 562 may be slightly lower than the doping concentration of the PBL 212. The exemplary range of doping concentration for the respective regions 230, 224, 222, 212, 562 has been described in various non-limiting embodiments above.

Although the doping profile 800 is described with reference to the semiconductor device 500, 600, 650 of FIG. 5, FIG. 6A and FIG. 6B above, it is understood that in various non-limiting embodiments, the doping profile for the semiconductor device 200, 300 of FIG. 2 and FIG. 3 may be similar to the doping profile 800, except that the N-Epi layer may be absent in the semiconductor device 200, 300.

Figure 8B:
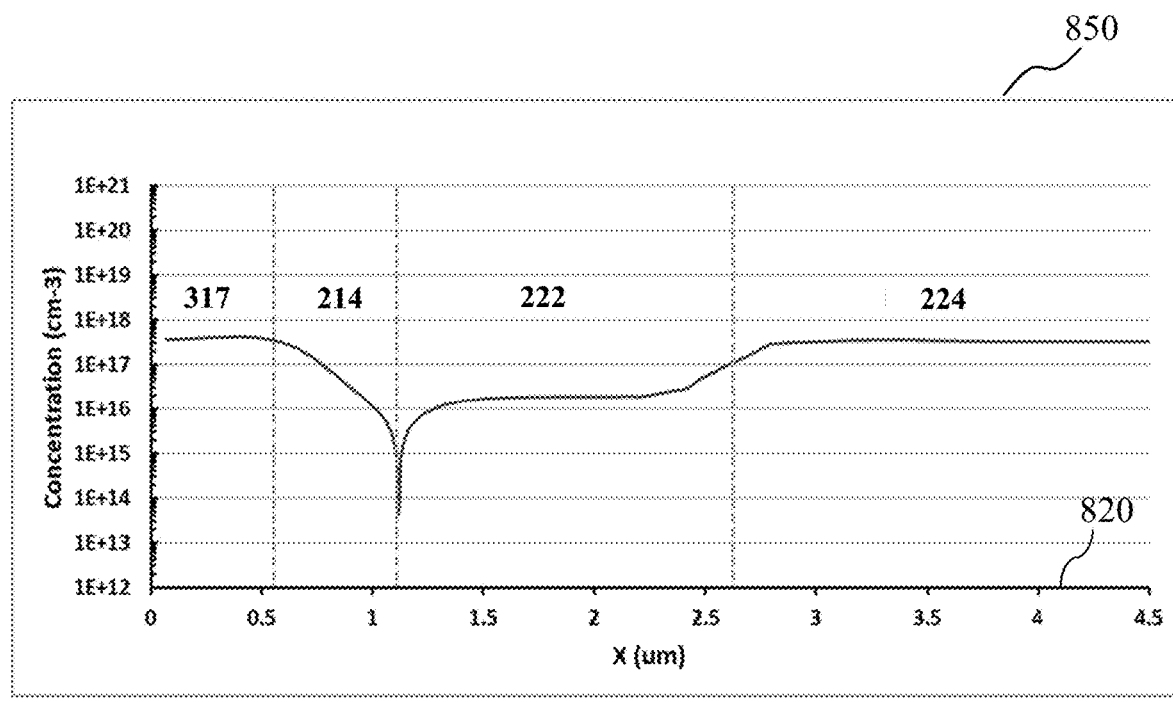
FIG. 8B shows an exemplary doping profile along a horizontal cutline through a semiconductor device according to various embodiments.

FIG. 8B shows an exemplary doping profile 850 along a horizontal line through the semiconductor device 200, 300, 500, 600, 650 according to various embodiments.

The doping profile 850 is illustrated along the horizontal line from the PWell region 317 towards the NWell1 region 224, through the P-Drift region 214 and the N-Drift region 222. As shown in FIG. 8B, the PWell region 317 may have a higher doping concentration than the P-Drift region 214, and the Nwell1 region 224 may have a higher doping concentration than the N-Drift region 222. The exemplary range of doping concentration for the respective regions 317, 214, 222, 224 has been described in various non-limiting embodiments above.

Figure 1B:
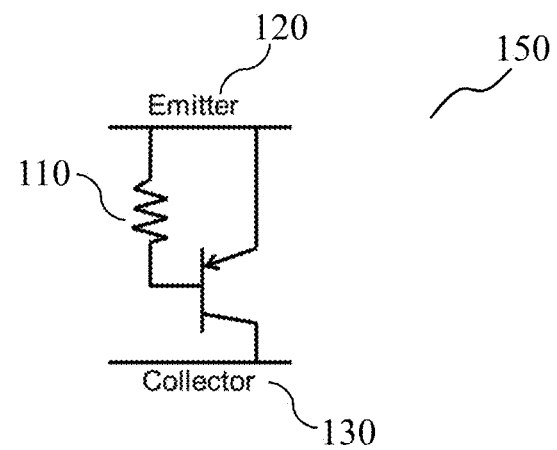
FIG. 1B shows an equivalent circuit of the conventional PNP device.
Figure 9:
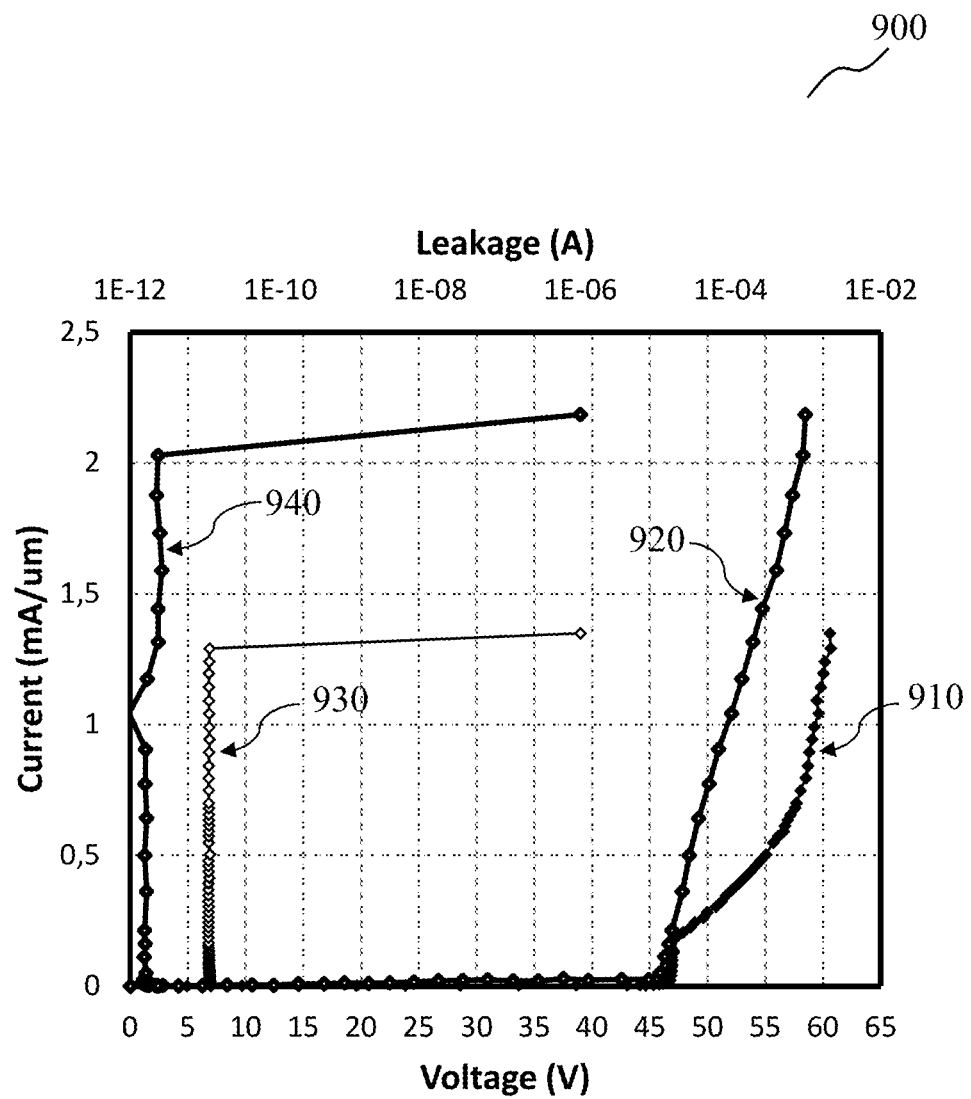
FIG. 9 shows a graph illustrating 100 ns Transmission Line Pulse (TLP) data comparison of the conventional PNP device of FIG. 1 and the semiconductor device of FIG. 5 according to various non-limiting embodiments.

FIG. 9 shows a graph 900 illustrating 100 ns Transmission Line Pulse (TLP) data comparison of the conventional PNP device 100 of FIG. 1 and the semiconductor device 500 of FIG. 5 according to various non-limiting embodiments.

As shown in FIG. 9, curve 910 represents a current versus voltage (I-V) curve of the conventional PNP device 100 with increasing input stress voltage, and curve 920 represents a I-V curve of the semiconductor device 500 with increasing input stress voltage. The input stress voltage may be applied to the conventional PNP device 100 and the semiconductor device 500 at a regular interval of 100 ns.

Curve 930 represents the leakage current of the conventional PNP device 100 measured after applying each ESD stress level, and curve 940 represents the leakage current of the semiconductor device 500 measured after applying each ESD stress level. If the devices 100, 500 fails, the leakage current may increase abruptly.

Table 1 further shows a data comparison of the conventional PNP device 100 of FIG. 1 and the semiconductor device 500 of FIG. 5 according to various non-limiting embodiments.

TABLE 1

Comparison of conventional PNP device 100 and semiconductor device 500

| | Normalized Failure Current It2 (mA/μm) | On-resistance (KΩ · μm) |
| --- | --- | --- |
| Device 500 | 2.03 | 6.9 |
| Device 100 | 1.29 | 23 |
| Comparison | 57% improvement | 70% reduction |

As illustrated in Curve 910, 920, and Table 1, the semiconductor device 500 of FIG. 5 according to various non-limiting embodiments may achieve a lower on-resistance of about 6.9KΩ·μm, compared to the on-resistance of 23KΩ·μm achieved by the conventional PNP device 100.

As illustrated in Curve 930, 940, and Table 1, the semiconductor device 500 of FIG. 5 according to various non-limiting embodiments may achieve a higher failure current of about 2.03 mA/μm, compared to the failure current of 1.29 mA/μm achieved by the conventional PNP device 100.

Compared to the conventional PNP device 100, the semiconductor device 500 according to various non-limiting embodiments may achieve 57% failure current improvement and 70% on-resistance reduction.

Experimental data as measured for the semiconductor device 500 shows that the semiconductor device 500 according to various non-limiting embodiments has good breakdown behavior even though its base is designed as floating. 3-site data also shows very less site to site variation, and the breakdown voltage variation from −40° C. to 175° C. is within around 5V.

Figure 10:
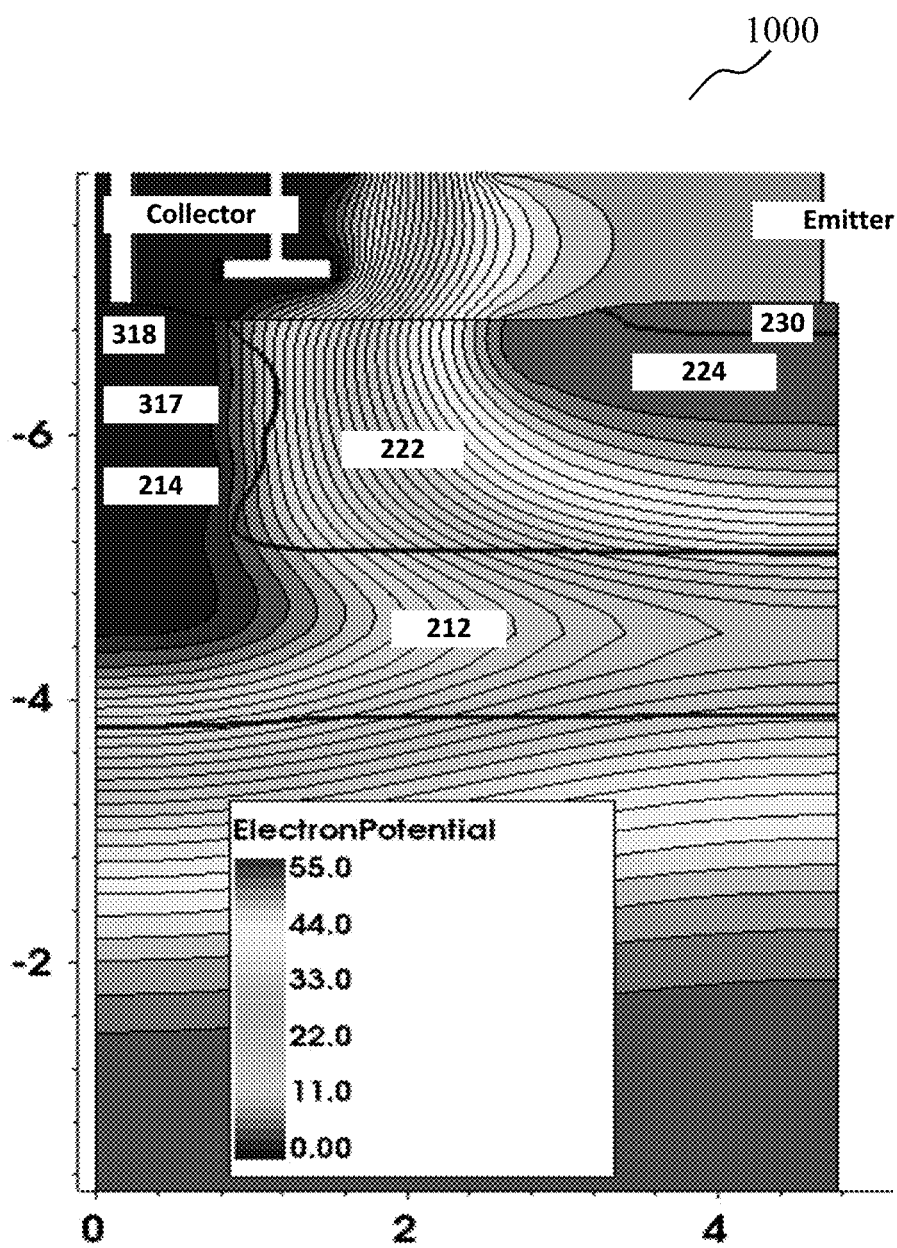
FIG. 10 shows a diagram illustrating simulated electrical potential around breakdown point for the semiconductor device of FIG. 5 according to various non-limiting embodiments.

FIG. 10 shows a diagram 1000 illustrating simulated electrical potential around breakdown point for the semiconductor device 500 of FIG. 5 according to various non-limiting embodiments. The electrical potential may be measured for the PNP device 500 as described in various embodiments above.

As shown in FIG. 10, the simulated electric potential is mostly dropping on the second well region 222, i.e. the N-Drift region 222, to sustain the high breakdown voltage.

Figure 11:
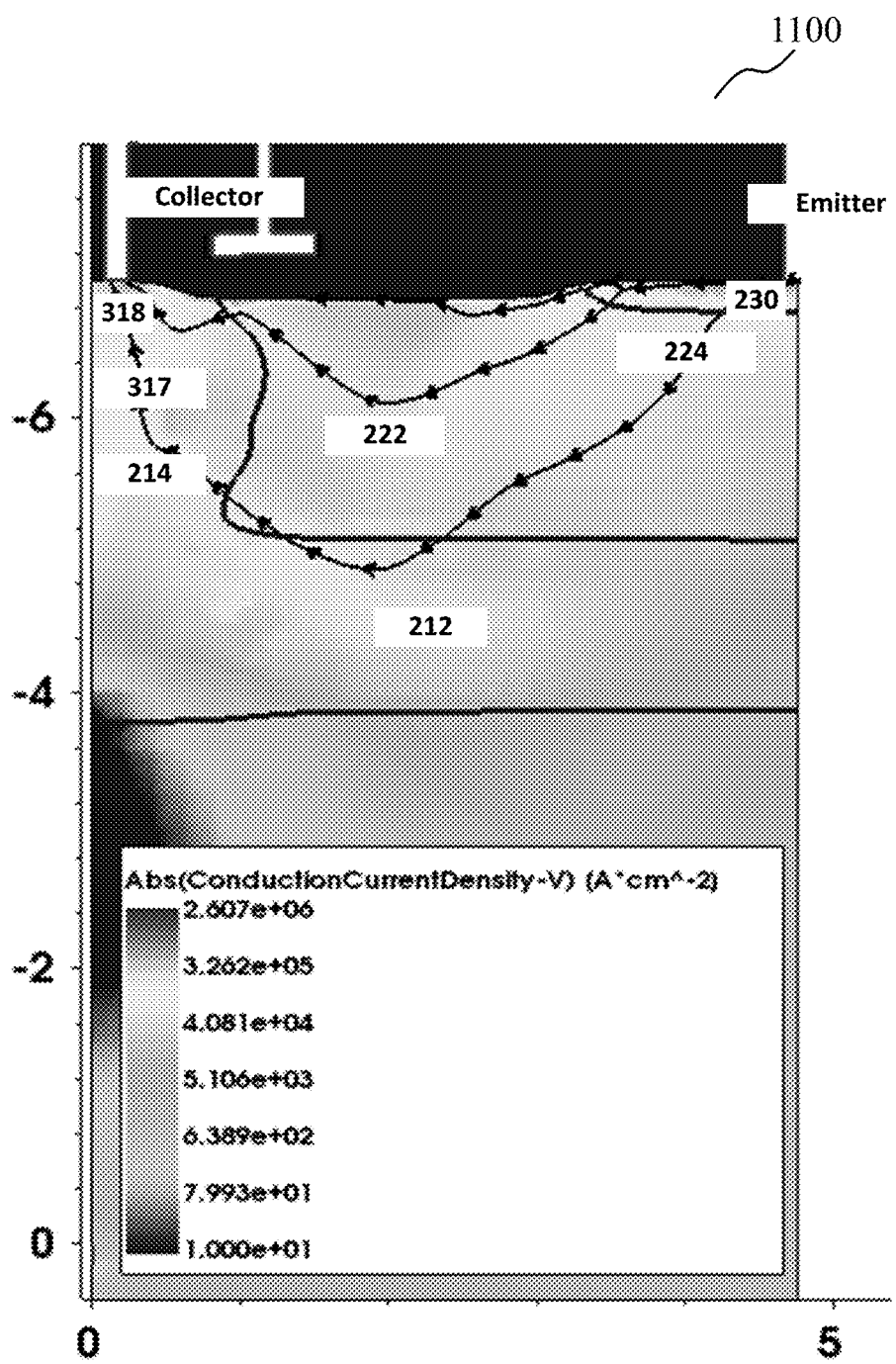
FIG. 11 shows a diagram illustrating simulated current density of the semiconductor device of FIG. 5 according to various non-limiting embodiments.

FIG. 11 shows a diagram 1100 illustrating simulated current density of the semiconductor device 500 of FIG. 5 according to various non-limiting embodiments. The current density may be measured for the PNP device 500 as described in various embodiments above, after the PNP device 500 is turned on.

As illustrated in FIG. 11, the simulated current density shows that the current is flowing both laterally and vertically between the emitter region 230 and the collector terminal region 318, after the PNP device 500 is turned on.

Table 2 shows TCAD (Technology Computer Aided Design) simulated breakdown voltage for the semiconductor device 500 of FIG. 5 with different LOCOS lengths, according to various non-limiting embodiments.

In the simulation results as shown in Table 2, the breakdown voltage of the semiconductor device 500 is increasing when the length of the LOCOS 240 is increasing. By increasing the LOCOS length (with other related doping regions as well), the semiconductor device 500 according to various embodiments can be configured to have different breakdown voltage applicable for different voltage rating.

TABLE 2

| TCAD simulated breakdown voltage for semiconductor device 500 | |
| --- | --- |
| LOCOS length (μm) | Breakdown voltage (V) |
| 2.8 | 57.9 |
| 3.4 | 75.5 |
| 4 | 87.7 |

According to various non-limiting embodiments as described above, the semiconductor device 200, 300, 500, 600, 650 is provided, which achieves lower on-resistance, i.e., good clamping ability as an ESD clamp, as well as higher failure current. The semiconductor device 200, 300, 500, 600, 650 may be a high voltage ESD protection device, which may include a PNP transistor or a NPN transistor.

In the following, a method of forming the semiconductor device 200, 300, 500, 600, 650 according to various non-limiting embodiments will be described.

Figure 12:
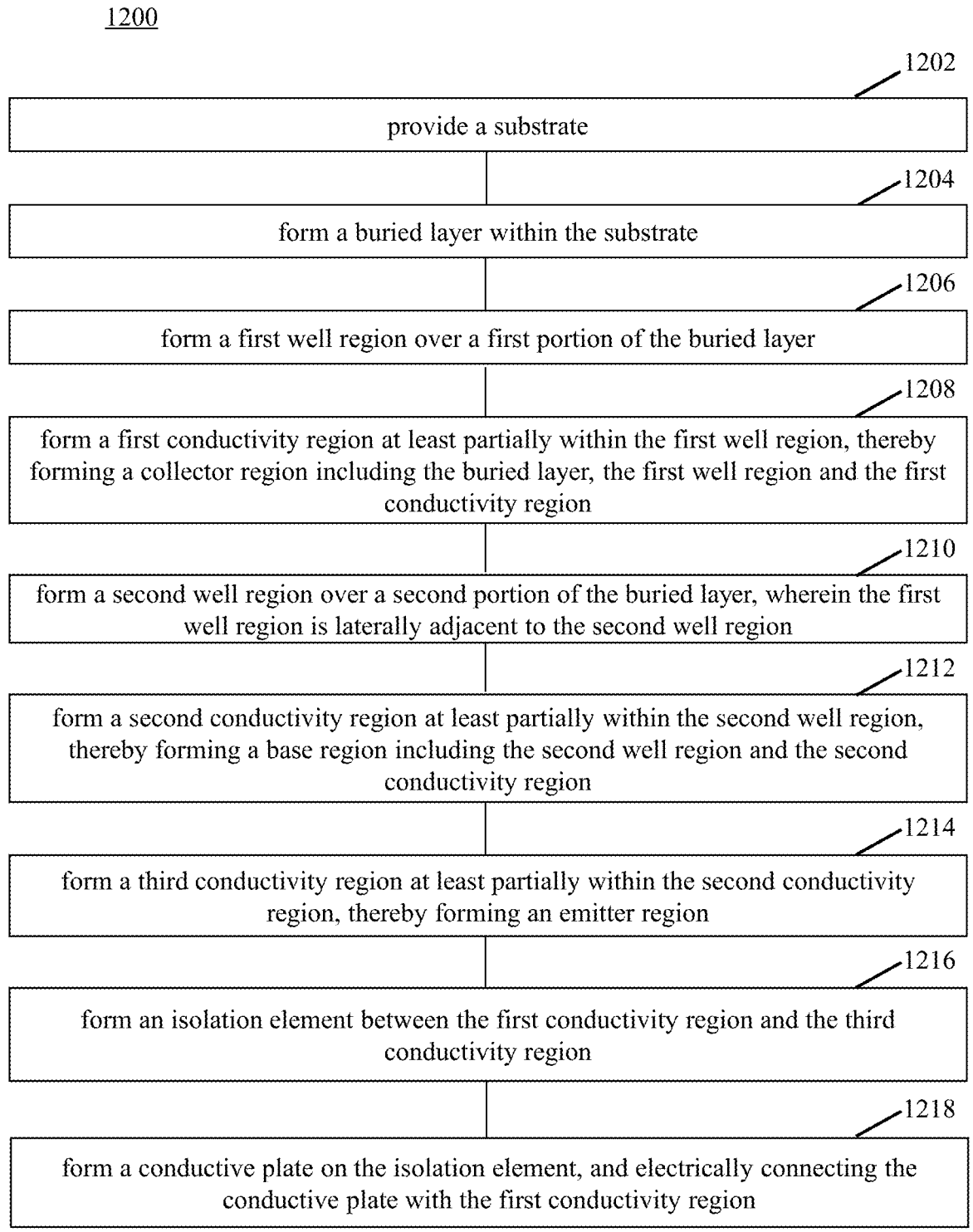
FIG. 12 shows a flowchart illustrating a method of forming a semiconductor device according to various non-limiting embodiments.

FIG. 12 shows a flowchart 1200 illustrating a method of forming a semiconductor device according to various non-limiting embodiments. The method may be used to form the semiconductor device 200, 300, 500, 600, 650 described in various non-limiting embodiments above. Various non-limiting embodiments described in context of the semiconductor device 200, 300, 500, 600, 650 above are analogously valid for the respective method, and vice versa.

At 1202, a substrate may be provided.

At 1204, a buried layer may be formed within the substrate.

At 1206, a first well region may be formed over a first portion of the buried layer.

At 1208, a first conductivity region may be formed at least partially within the first well region, thereby forming a collector region including the buried layer, the first well region and the first conductivity region.

At 1210, a second well region may be formed over a second portion of the buried layer, wherein the first well region is laterally adjacent to the second well region;

At 1212, a second conductivity region may be formed at least partially within the second well region, thereby forming a base region including the second well region and the second conductivity region;

At 1214, a third conductivity region may be formed at least partially within the second conductivity region, thereby forming an emitter region.

At 1216, an isolation element may be formed between the first conductivity region and the third conductivity region.

At 1218, a conductive plate may be formed on the isolation element, and the conductive plate may be electrically connected with the first conductivity region.

The buried layer, the first well region, the first conductivity region, and the third conductivity region may have a first conductivity type. The second well region and the second conductivity region may have a second conductivity type different from the first conductivity type.

It is understood that the method may not be carried out in the sequence of 1202-1218 according to various embodiments. For example, the forming of the second well region at 1210 may be carried out before the forming of the first conductivity region at 1208 according to a non-limiting embodiment.

According to various non-limiting embodiments, the isolation element may be at least partially formed in the substrate, to space the first conductivity region apart from the third conductivity region. In various non-limiting embodiments, the isolation element may be at least partially formed over the first well region and the base region. In various non-limiting embodiments, the isolation element may be formed in contact with a top surface of the first well region, a top surface of the second well region, and/or a top surface of the second conductivity region.

According to various non-limiting embodiments, the method may further include at least partially arranging the isolation element over a p-n junction formed between the first well region and the second well region.

In various non-limiting embodiments, the method may include forming at least one of a local oxidation of silicon (LOCOS) isolation, a shallow trench isolation (STI) or a field oxide deposition (FOD) isolation as the isolation element.

According to various non-limiting embodiments, the method may further include at least partially arranging the conductive plate over a p-n junction formed between the first well region and the second well region. In other words, the conductive plate may be at least partially overlapping or bridged over the p-n junction formed between the first well region and the second well region, with the isolation element arranged inbetween.

According to various non-limiting embodiments, a terminal contact may not be formed in the base region, such that the base region is configured to be floating.

In various non-limiting embodiments, forming the first conductivity region may include forming a third well region and forming a terminal region at least partially within the third well region. The terminal region may have a higher doping concentration than the third well region. In various non-limiting embodiments, the terminal region may be formed with a doping concentration in a range from about $5E19$ cm$^{-3}$ to about $5E20$ cm$^{-3}$. The third well region may be formed with a doping concentration in a range from about $1E17$ cm$^{-3}$ to about $1E19$ cm$^{-3}$.

In various non-limiting embodiments, the first conductivity region may be formed with a higher doping concentration than the first well region. The first well region may form a drift region of the semiconductor device. In various non-limiting embodiments, the first well region may be formed with a doping concentration in a range from about $1E16$ cm$^{-3}$ to about $5E17$ cm$^{-3}$.

In various non-limiting embodiments, the second conductivity region may be formed with a higher doping concentration than the second well region. The second well region may form a drift region of the semiconductor device. In various non-limiting embodiments, the second conductivity region may be formed with a doping concentration in a range from about $1E17$ cm$^{-3}$ to about $1E18$ cm$^{-3}$. The second well region may be formed with a doping concentration in a range from about $1E16$ cm$^{-3}$ to about $1E17$ cm$^{-3}$.

According to various non-limiting embodiments, the first well region may be formed in contact with the buried layer. In other words, the first well region may be formed on a top surface of the buried layer. According to various non-limiting embodiments, the entire second well region may be formed on the buried layer, and may be in contact with the buried layer. The buried layer may extend horizontally under the first well region and the second well region.

In various non-limiting embodiments, the buried layer and the second well region may be formed with comparable doping concentrations. In other words, the doping concentration of the buried layer may be similar to, e.g. on the same order as, the doping concentration of the second well region. In various non-limiting embodiments, the doping concentrations of the buried layer and the second well region may be the same. In various non-limiting embodiments, the buried layer may be formed with a doping concentration in a range from about $1E16$ cm$^{-3}$ to about $1E17$ cm$^{-3}$, and the second well region may be formed with a doping concentration in a range from about $1E16$ cm$^{-3}$ to about $1E17$ cm$^{-3}$.

In various non-limiting embodiments, the third conductivity region may be formed with a doping concentration in a range from about $5E19$ cm$^{-3}$ to about $5E20$ cm$^{-3}$.

According to various non-limiting embodiments, the first well region and the first conductivity region may be formed at least partially surrounding the second well region, the second conductivity region, and the third conductivity region.

According to various non-limiting embodiments, the first well region and the first conductivity region may be formed at a first side of the second well region, wherein a further first well region and a further first conductivity region may be formed at a second side of the second well region. The first side may be opposite to the second side. The buried layer may extend horizontally under the first well region and the second well region so as to connect the first well region to the further first well region.

According to various non-limiting embodiments, the method may further include forming a fourth conductivity region within the substrate. The fourth conductivity region may be formed at least partially under the buried layer and at least partially surrounding the first well region and the first conductivity region, wherein the fourth conductivity region has the second conductivity type. The first well region, the first conductivity region and the fourth conductivity region may form a diode.

In various non-limiting embodiments, forming the fourth conductivity region may further include forming an epitaxial layer within the substrate and forming a terminal region arranged at least partially within the epitaxial layer. The terminal region may be formed with a higher doping concentration than the epitaxial layer. In various non-limiting embodiments, the terminal region may be formed with a doping concentration in a range from about $5E19$ cm$^{-3}$ to about $5E20$ cm$^{-3}$. The epitaxial layer may be formed with a doping concentration in a range from about $5E15$ cm$^{-3}$ to about $5E16$ cm$^{-3}$.

In various non-limiting embodiments, the method may further include electrically connecting the terminal region of the fourth conductivity region with the third conductivity region, and forming a further isolation element to space the terminal region of the fourth conductivity region apart from the first conductivity region. Accordingly, the diode formed by the fourth conductivity region, the first well region and the first conductivity region is connected in parallel with the transistor formed by the collector region, the base region and the emitter region, and may create a current path between the collector and the emitter.

According to various non-limiting embodiments, the method may further include biasing the first conductivity region at a first voltage, and biasing the third conductivity region at a second voltage different from the first voltage. In an non-limiting embodiment wherein the semiconductor device is formed with the PNP transistor, the second voltage may be higher than the first voltage. In an non-limiting embodiment wherein the semiconductor device is formed with the NPN transistor, the second voltage may be lower than the first voltage. When a difference between the first voltage and the second voltage exceeds a predetermined threshold, e.g., a breakdown voltage of the transistor, the semiconductor device may be configured such that a first current passes laterally between the third conductivity region and the first conductivity region through the second conductivity region, the second well region and the first well region, and a second current passes vertically between the third conductivity region and the first conductivity region through the second conductivity region, the second well region, the buried layer and the first well region.

The semiconductor device formed according to the method of various non-limiting embodiments above may be an ESD protection device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor device comprising:
   a substrate;

a collector region arranged within the substrate, wherein the collector region comprises a buried layer arranged within the substrate, a first well region arranged over a first portion of the buried layer, and a first conductivity region arranged at least partially within the first well region;

a base region arranged over a second portion of the buried layer, wherein the base region comprises a second well region arranged over the second portion of the buried layer and a second conductivity region arranged at least partially within the second well region, wherein the first well region is laterally adjacent to the second well region;

an emitter region comprising a third conductivity region arranged at least partially within the second conductivity region;

an isolation element arranged between the first conductivity region and the third conductivity region; and a conductive plate arranged on the isolation element, wherein the conductive plate is electrically connected with the first conductivity region;

wherein the buried layer, the first well region, the first conductivity region, and the third conductivity region have a first conductivity type; and wherein the second well region and the second conductivity region have a second conductivity type different from the first conductivity type.

2. The semiconductor device of claim 1, wherein the isolation element is at least partially arranged over a p-n junction formed between the first well region and the second well region.

3. The semiconductor device of claim 1, wherein the isolation element comprises at least one of a local oxidation of silicon isolation, a shallow trench isolation, or a field oxide deposition isolation.

4. The semiconductor device of claim 1, wherein the conductive plate is in contact with the isolation element and is spaced apart from the collector region, the base region and the emitter region.

5. The semiconductor device of claim 1, wherein the conductive plate comprises polysilicon or metal.

6. The semiconductor device of claim 1, wherein the conductive plate, the isolation element, the second well region and the buried layer form a reduced surface field (RESURF) structure.

7. The semiconductor device of claim 1, wherein a terminal contact is absent from the base region, such that the base region is configured to be floating.

8. The semiconductor device of claim 1, wherein the first conductivity region comprises a third well region and a terminal region arranged at least partially within the third well region.

9. The semiconductor device of claim 1, wherein the second well region is entirely arranged on the buried layer and is in contact with the buried layer, and wherein the first well region is in contact with the buried layer.

10. The semiconductor device of claim 1, wherein the first well region and the first conductivity region are arranged at least partially surrounding the second well region, the second conductivity region, and the third conductivity region.

11. The semiconductor device of claim 1, wherein the first well region and the first conductivity region are arranged at a first side of the second well region, wherein a further first well region and a further first conductivity region are arranged at a second side of the second well region, wherein the buried layer extends horizontally under the first well region and the second well region so as to connect the first well region to the further first well region.

12. The semiconductor device of claim 1, further comprising a fourth conductivity region arranged within the substrate, wherein the fourth conductivity region is arranged at least partially under the buried layer and at least partially surrounding the first well region and the first conductivity region, wherein the fourth conductivity region has the second conductivity type.

13. The semiconductor device of claim 12, wherein the first well region, the first conductivity region and the fourth conductivity region form a diode.

14. The semiconductor device of claim 12, wherein the fourth conductivity region comprises an epitaxial layer and a terminal region arranged at least partially within the epitaxial layer.

15. The semiconductor device of claim 14, wherein the terminal region of the fourth conductivity region is electrically connected with the third conductivity region, wherein the terminal region of the fourth conductivity region is spaced apart from the first conductivity region via a further isolation element.

16. The semiconductor device of claim 1, wherein the first conductivity region is biased at a first voltage, and the third conductivity region is biased at a second voltage different from the first voltage, wherein the semiconductor device is configured such that when a difference between the first voltage and the second voltage exceeds a predetermined threshold, a first current passes laterally between the third conductivity region and the first conductivity region through the second conductivity region, the second well region and the first well region, and a second current passes vertically between the third conductivity region and the first conductivity region through the second conductivity region, the second well region, the buried layer and the first well region.

17. The semiconductor device of claim 4, wherein the conductive plate is at least partially arranged to extend laterally over a p-n junction formed between the first well region and the second well region.

18. The semiconductor device of claim 4, wherein the conductive plate is in physical contact with the isolation element.

* * * * *